US008383327B2

(12) United States Patent
Betschon et al.

(10) Patent No.: US 8,383,327 B2
(45) Date of Patent: Feb. 26, 2013

(54) METHOD FOR PRODUCING AN ELECTRO-OPTICAL PRINTED CIRCUIT BOARD WITH OPTICAL WAVEGUIDE STRUCTURES

(75) Inventors: Felix Betschon, St. Gallen (CH); Markus Halter, Diepoldsau (CH)

(73) Assignee: vario-optics ag, Heiden (CH)

( * ) Notice: Subject to any disclaimer, the term of this patent is extended or adjusted under 35 U.S.C. 154(b) by 568 days.

(21) Appl. No.: 12/706,643

(22) Filed: Feb. 16, 2010

(65) Prior Publication Data
US 2010/0209854 A1 Aug. 19, 2010

(30) Foreign Application Priority Data

Feb. 17, 2009 (CH) .......................... 251/09
Sep. 30, 2009 (CH) ....................... 1508/09

(51) Int. Cl.
*G03F 7/20* (2006.01)

(52) U.S. Cl. .................. 430/321; 430/320; 430/314

(58) Field of Classification Search ................... None
See application file for complete search history.

(56) References Cited

U.S. PATENT DOCUMENTS

| 5,459,081 | A | | 10/1995 | Kajita | |
|---|---|---|---|---|---|
| 5,600,745 | A | | 2/1997 | Wuu et al. | |
| 5,907,646 | A | * | 5/1999 | Kitamura | 385/14 |
| 6,553,171 | B1 | | 4/2003 | Takahashi et al. | |
| 2005/0205201 | A1 | * | 9/2005 | Kim et al. | 156/257 |
| 2005/0284181 | A1 | | 12/2005 | Smith et al. | |
| 2007/0153276 | A1 | * | 7/2007 | Blidegn | 356/401 |
| 2008/0304802 | A1 | * | 12/2008 | Watanabe et al. | 385/134 |

FOREIGN PATENT DOCUMENTS

| EP | 1 120 672 | 8/2001 |
|---|---|---|
| EP | 1 972 975 | 9/2008 |
| EP | 2 000 837 | 12/2008 |
| WO | 93/21550 | 10/1993 |

* cited by examiner

*Primary Examiner* — Cynthia Kelly
*Assistant Examiner* — Anna Verderame
(74) *Attorney, Agent, or Firm* — Nixon Peabody LLP

(57) ABSTRACT

An electro-optical printed circuit board contains electrical conductor tracks on the one hand and optical waveguide structures on the other hand. The optical waveguide structures comprise a bottom layer, a core layer and a cladding layer. Visible areas are applied to the printed circuit board, and the core layer is applied later both to the bottom layer as well as the visible areas and structured both on the bottom layer as well as the visible areas. This structure is then transferred to the visible areas, e.g. by etching. Reference marks are thus produced which contain the information on the actual position of the optical waveguide structures.

20 Claims, 6 Drawing Sheets

METHOD FOR PRODUCING AN ELECTRO-OPTICAL PRINTED CIRCUIT BOARD WITH OPTICAL WAVEGUIDE STRUCTURES

PRIORITY CLAIM

The present application is related to and claims foreign priority under 35 U.S.C §119 from Swiss Patent Application No. 251/09 filed Feb. 17, 2009 and from Swiss Patent Application No. 1508/09 filed Sep. 30, 2009, the disclosures of which are herein incorporated by reference.

FIELD OF THE INVENTION

The present invention concerns a method for producing an electro-optical printed circuit board with optical waveguide structures.

BACKGROUND OF THE INVENTION

The electro-optical printed circuit board technology relates to the production of printed circuit boards which connect electronic, electro-optical and optical components with one another. They contain electrical conductor tracks on the one hand and optical waveguide structures on the other hand.

Optical waveguide structures consist of a plurality of transparent layers, which are usually three layers, made of UV-curing polymer materials with different refractive indexes. As a result of the transparency, the optical waveguide structures cannot be detected by means of image recognition systems during the mounting of the components. A precise alignment of electro-optical components such as LEDs, laser sources, photodiodes or other elements such as optical fibers etc. on the basis of the optical waveguide structures and relative to the optical waveguide structures is not possible because of their transparency. The precise alignment of the individual components relative to one another is mandatorily required however.

A method for producing optical waveguide structures is known from EP 2000837 which comprises a bottom layer (or under-cladding layer), a core layer and a cladding layer (or over-cladding layer). These layers are applied step by step to a substrate, e.g. a glass pane, and are each structured with the help of an exposure mask. In the first step, the bottom layer is applied to the substrate. Then a structuring of the bottom layer occurs with the exposure through a first exposure mask and a removal of the non-exposed sections, with exposed reference marks also being produced from the material of the bottom layer. The reference marks are not visible because the bottom layer is transparent. In order to make them visible, they are covered in the next step with a metal film. For this purpose, the remaining areas of the bottom layer need to be covered and the reference marks are then coated with metal. This occurs in a vacuum chamber by vapor deposition or sputtering. The reference marks are used in the further production of the optical waveguide structures in order to align the exposure masks for structuring the core layer and the cladding layer.

A method for producing passive optical components with optical waveguide structures is known from EP 1120672, where structures are combined with active optical components within an optical element. A bottom layer, a core layer, a metal layer and a cladding layer are applied step by step to a substrate of silicon and are each structured with the help of exposure masks. The core layer and the metal layer are structured jointly with the help of an exposure mask and a respective exposure and removal of the non-exposed sections. Thereafter, the metal layer is removed on those parts of the structured core layer which form the optical waveguide structures, whereas other parts of the structured core layer with the metal layer are not removed and thus form visible adjusting marks. The adjusting marks are used later on in order to connect these passive components with active optical elements which have a structure which is complementary to and corresponds to the adjusting marks.

An optical waveguide structure in which the core layer and the metal-coated reference marks are formed simultaneously is also known from U.S. Pat. No. 6,553,171.

SHORT DESCRIPTION OF THE INVENTION

It is the object of the present invention to provide a method for producing an electro-optical printed circuit board with optical waveguide structures which enables a highly precise mounting of electro-optical components with respect to the optical waveguide structures without the components having to be actively adjusted during the mounting.

The light moves along the tracks defined by the structures of the core layer of the optical waveguide structures. The method in accordance with the invention is based on the idea of applying the core layer both to the bottom layer as well as to unstructured, non-transparent areas, i.e. clearly visible areas, and to structure the core layer not only on the bottom layer but also on the non-transparent areas, and thereafter transferring or transforming this structure into the non-transparent areas, e.g. by etching. In this way the at the beginning unstructured, non-transparent areas become visible reference marks which contain the information on the actual position of the structured core layer of the optical waveguide structures and thus on the position of the tracks which guide the light.

It is alternatively possible to apply a photoresist instead of material of the core layer to the unstructured, non-transparent areas, with structures in the core layer and in the photoresist being produced simultaneously by exposure through the same exposure mask.

The reference marks can be used in order to produce depressions and/or holes in the printed circuit board by mechanical machining or laser-beam machining which are then aligned in a highly precise manner in relation to the core layer.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The drawings are schematic and are not shown true to scale. The drawings show snapshots during the production process of an electro-optical printed circuit board. In the drawings.

DETAILED DESCRIPTION OF THE INVENTION

Figure 1A:
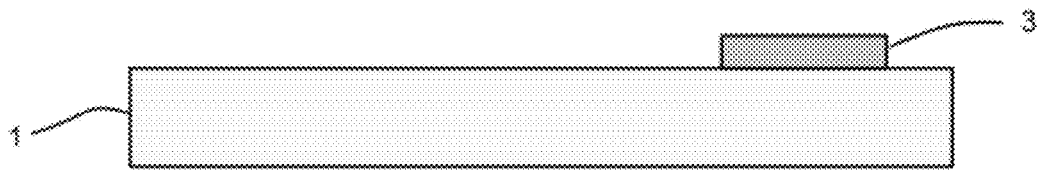
FIG. 1a shows a sectional view through a substrate on which an unstructured, non-transparent area is provided.

An electro-optical printed circuit board with optical waveguide structures consists of a substrate 1, on which metallic structures, especially tracks, for the electrical connection of electronic and electro-optical components are arranged on the one hand and optical waveguide structures on the other hand. The substrate 1 consists for example of FR4, polyimide or any other suitable material.

The method in accordance with the invention for producing an electro-optical printed circuit board with optical waveguide structures comprises the method steps A through F and optionally the method step G, which shall be explained below in detail by reference to FIGS. 1a to 1k:

A) Forming non-transparent areas 3 on the substrate 1.
With this step a non-transparent material is disposed over the substrate 1 and, if necessary, structured such that non-transparent areas 3 are formed on the substrate 1. The state after this step is shown in FIG. 1 a.

The optical waveguide structures consist of three layers, which are a bottom layer 2, a core layer 4 and a cladding layer 5. The bottom layer 2 and the core layer 4 are optically transparent. Mostly, the cladding layer 5 is also transparent. The waveguide properties are a result of the fact that the refractive index of the core layer 4 differs from the refractive index of the bottom layer 2 and the cladding layer 5. The structures of these three layers are formed by conventional photolithographic process steps, namely the exposure to electromagnetic radiation through one exposure mask 8a (FIG. 1b), 8b (FIGS. 1d) and 8c (FIG. 1g) each, and subsequent removal of the non-exposed areas. Conventional exposure masks can be used as exposure masks 8a, 8b and 8c which are commonly used in the production of printed circuit boards and semiconductors. Typically these are chromium-coated glass panes which are structured accordingly. The term "electromagnetic radiation" is to be understood throughout the specification that the electromagnetic radiation may particularly be UV light. The bottom layer 2 and the cladding layer 5 are usually layers which cover a certain area and only the core layer 4 is structured within this area in order to form individual optical waveguides. The exposure masks 8a, 8b and 8c are aligned by special (not shown) reference marks located on the substrate 1, so-called "fiducials", with respect to substrate 1.

The non-transparent areas 3, which may also be called non-transparent blocks, have no special form or structure. They are rectangular or square for example and must be optically visible, i.e. they have high opacity. The non-transparent areas 3 are advantageously formed from metal, e.g. from a thin copper layer whose layer thickness typically lies in the range of approx. 10 μm to 100 μm, but which can also assume larger values of up to 210 μm or even more. The printed circuit board contains at least one layer with electric connecting lines which are usually made of copper. The non-transparent areas 3 are advantageously produced simultaneously with these connecting lines.

The optical waveguide structures are produced with the next steps B, C1 or C2, D and E.

B) Applying the bottom layer 2 to the substrate 1 and structuring the bottom layer 2 in such a way that the bottom layer 2 does not cover the non-transparent areas 3.

The bottom layer 2 consists of a first polymer which can be cured by exposure to electromagnetic radiation. The application and the structuring of the polymer occurs in three partial steps:

1) The polymer is applied to the substrate, e.g. by doctor blading, spin coating, inkjetting or any other known method, and forms a large-area, still unstructured polymer layer. These methods allow applying the polymer either to the entire substrate or only locally to certain areas on the substrate.

Figure 1B:
FIG. 1b shows a sectional view through the substrate with applied bottom layer during the UV exposure process with a first exposure mask.

2) Predetermined regions of this polymer layer are cured by means of electromagnetic radiation. For doing so, a first exposure mask 8a is aligned with respect to substrate 1 by means of (not-shown) fiducials located on the substrate 1. Thereafter, the polymer layer is cured with electromagnetic radiation through the first exposure mask 8a. The exposed regions are cured during the exposure, the non-exposed regions are not cured. The exposure mask 8a thus defines the position of the regions to be cured in relation to the fiducials. This state is shown in FIG. 1b.

Figure 1C:
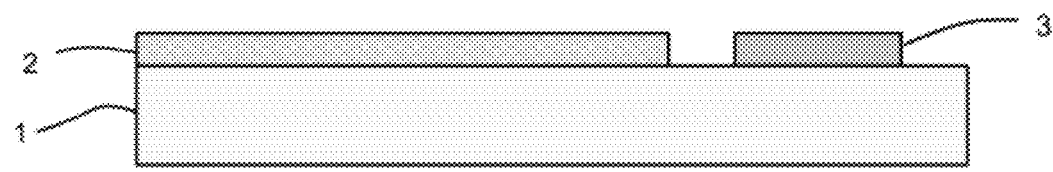
FIG. 1c shows a sectional view through the substrate after the non-exposed material of the bottom layer has been removed.

3) The non-exposed first polymer is removed, e.g. by washing it away, so that only the cured regions of the polymer layer remain as a structured bottom layer 2 on the substrate 1. This state is shown in FIG. 1c.

The predetermined regions are located adjacent to the non-transparent areas 3, so that the structured bottom layer 2 and the non-transparent areas 3 will not overlap.

This is now followed either by step C1 or alternatively by step C2:

C1) Applying the core layer 4, with the core layer 4 covering both the structured bottom layer 2 as well as the non-transparent areas 3.

C2) Applying the core layer 4, with the core layer 4 not covering the non-transparent areas 3, and applying a photoresist layer 10 which covers only the non-transparent areas 3, but not the core layer 4.

The core layer 4 consists of a second polymer which can be cured by exposure to electromagnetic radiation. Tests have shown that the used polymers offer exceptional bonding values on copper in the cured state. In this case, the method step C1 is used. If another material which does not adhere well to copper or the intended metal must be used for application specific reasons, a conventional UV-curing photoresist can be applied partly to the unstructured visible areas 3. In this case, method step C2 is used.

The following steps are the same in both cases of C1 and C2.

D) Structuring the core layer 4 and, if applicable, the photoresist layer 10 by exposure of portions of them to electromagnetic radiation through a second exposure mask 8b and subsequent removal of the non-exposed portions of the core layer 4 and, if applicable, the non-exposed portions of the photoresist layer 10, with structured regions of the core layer 4 or of photoresist, respectively, with at least one opening or cut remaining on the non-transparent areas 3.

Figure 1D:
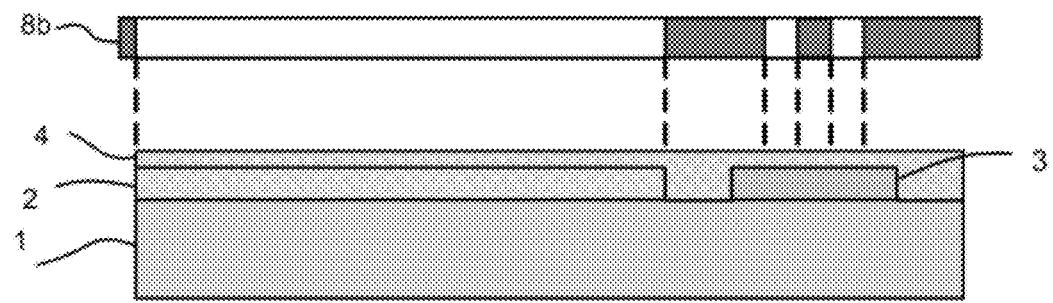
FIG. 1d shows a sectional view through the substrate with applied core layer during the UV exposure process with a second exposure mask.
Figure 1E:
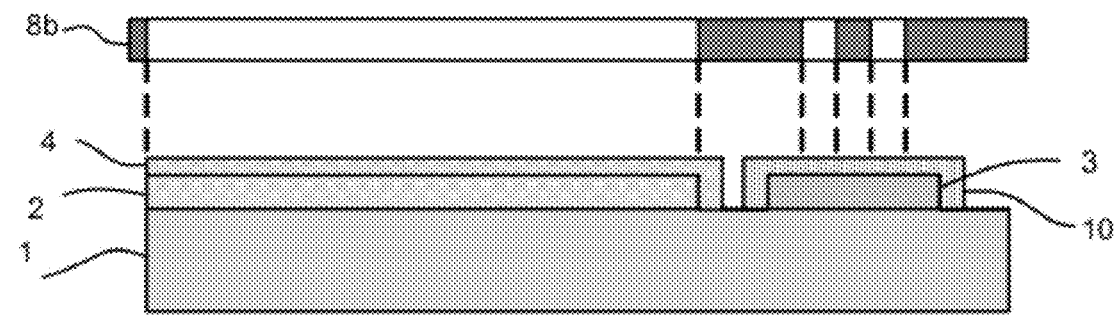
FIG. 1e shows a sectional view through the substrate after the bottom layer has been covered with the core layer and the non-transparent area has been covered with a UV-curing photoresist.

Method step D is performed in principle with similar partial steps as the partial steps 2 and 3 in method step B. The exposure mask 8b is aligned to the fiducials on substrate 1. FIG. 1d shows the state during the exposure to electromagnetic radiation when the production of the printed circuit board occurs with step C1. FIG. 1e shows the state during the exposure to electromagnetic radiation when the production of the printed circuit board occurs with step C2.

Figure 1F:
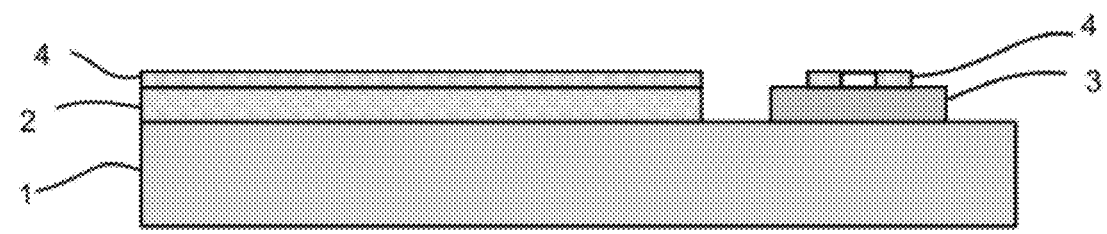
FIG. 1f shows a sectional view through the substrate after the non-exposed material of the core layer has been removed.

FIG. 1f shows the state after the removal of the non-exposed parts of the core layer 4 when the production of the printed circuit board occurred with the step C1. The state after method step D is nearly the same when the production of the printed circuit board was made with step C2, with the difference that the non-transparent areas 3 are coated in the one case with the polymer of the core layer 4 and in the other case with photoresist.

E) Applying and structuring the cladding layer 5 in such a way that the cladding layer 5 does not cover the non-transparent areas 3.

Figure 1G:
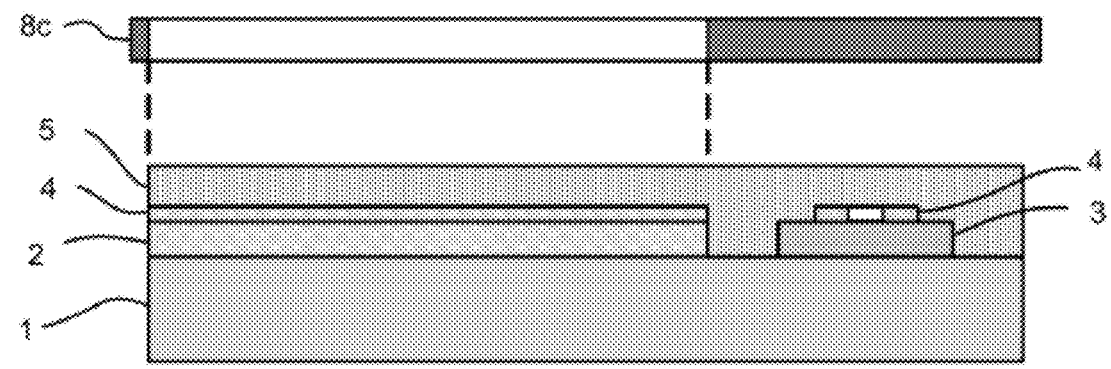
FIG. 1g shows a sectional view through the substrate with applied cladding layer during the UV exposure process with a third exposure mask.
Figure 1H:
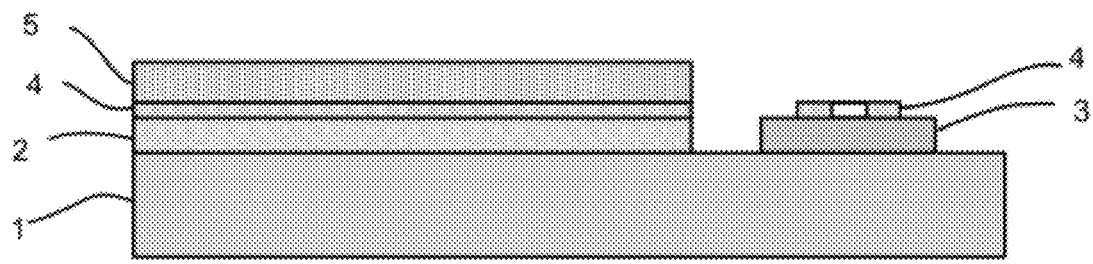
FIG. 1h shows a sectional view through the substrate after the non-exposed material of the cladding layer has been removed.

The cladding layer 5 consists of the same polymer as the bottom layer 2 or a third polymer that can be cured by exposure to electromagnetic radiation. The method step E is performed in principle with the same partial steps as the partial steps 2 and 3 in the method step B. A third exposure mask 8c is used for structuring the cladding layer 5, which mask is aligned with respect to substrate 1 by means of the substrate's fiducials. The exposure mask 8c is opaque in the region of the non-transparent areas 3, so that after the exposure to electromagnetic radiation through the exposure mask 8c there is a structured cured layer of the material of the core layer 4 or of photoresist 10, respectively, on the non-transparent areas 3 and on top thereof is an unstructured, non-cured layer of the material of the cladding layer 5. This state is shown in FIG. 1g. During the subsequent removal of the non-exposed material, structured regions consisting of the material of the core layer 4 or photoresist 10, respectively, remain on the non-transparent areas 3. This state is shown in FIG. 1h.

The next method step F is used to convert the invisible structures from the material of the core layer 4 or photoresist 10 which are disposed on the non-transparent areas 3 and characterize the actual position of the optical waveguide structures into visible structures which can be used in order to enable the alignment and fixing of the electro-optical components during the later mounting on the substrate 1 without any adjusting steps.

F) Transforming the structures on the visible areas 3 which are formed by the structured regions of the core layer 4 or photoresist, respectively, into the non-transparent areas 3.

Figure 1I:
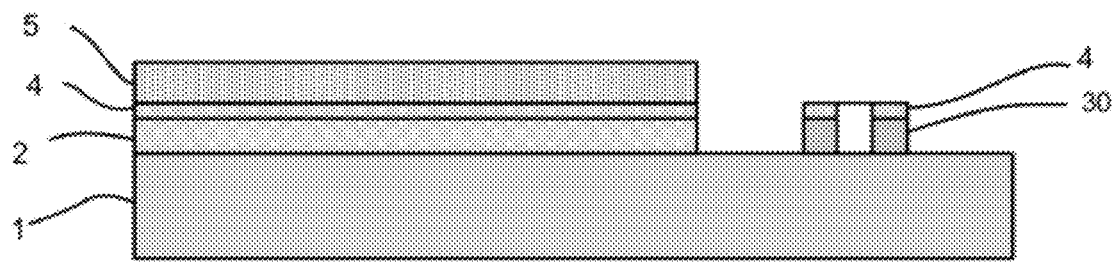
FIG. 1i shows a sectional view through the substrate after the structure of the core layer remaining on the non-transparent area has been transferred to the non-transparent area.
Figure 2A:
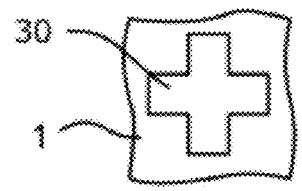
FIG. 2a shows a top view of an area having the form of a cross.
Figure 2B:
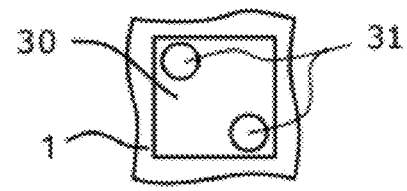
FIG. 2b shows a top view of a square area with two holes arranged on a diagonal line of the area.
Figure 2C:
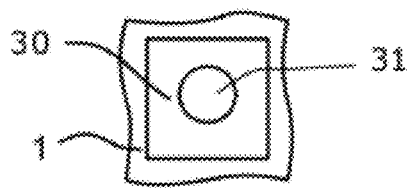
FIG. 2c shows a top view of a square area with a central hole.

Since the non-transparent areas 3 consist of an optically well visible material, especially metal, the structured regions of the core layer 4 or photoresist, respectively, are transformed to the non-transparent areas 3, by removing material from the non-transparent areas 3 within the structured regions, preferably by an etching process, with the structured regions of the core layer 4 or photoresist 10 being used as an etching mask. I.e. the structures of the structured regions define which portions of the non-transparent areas 3 are removed. FIG. 1i shows the printed circuit board after this step. The non-transparent areas are now structured areas, i.e. they constitute reference marks 30. FIGS. 2a to 2c show a top view of preferred examples of reference marks 30.

The ends of the invisible layers (bottom layer 2, core layer 4, cladding layer 5) of the optical waveguide structure and the visible reference marks 30 are positioned with respect to one another in a highly precise manner. The precision depends only on the used second exposure mask 8b and lies in the range of a few 10 nm.

The sequence of the method steps F and E can also be switched.

It is possible to apply further optical or electric layers on the three layers (bottom layer 2, core layer 4 and cladding layer 5) of the optical waveguide structures, e.g. by lamination onto the same by pressing.

The printed circuit board can now be used, which means the intended electronic and electro-optical components can be mounted, with the reference marks 30 being used by the assembly equipment in order to align the electro-optical components.

Electro-optical components can contain positioning pins which are inserted into respective holes in the printed circuit board during mounting. The reference marks 30 are used now in order to enable the mounting of such components without any further adjustment. Method step G is used for this purpose.

G) Producing holes 11 or recesses in the substrate 1, with the reference marks 30 being used in order to define the position of the holes 11 or recesses. The holes 11 pass completely through the substrate 1, in contrast to this the recesses do not.

The holes 11 are made in the substrate 1 either by means of a mechanical tool such as a drill or milling cutter or by means of a laser. The alignment and control of the tool or laser occurs by means of the reference marks 30. In the case of a laser, the reference marks 30 can be used as screens, which further increases the precision.

The form of the holes 11 is not limited to a round form. The machining of the substrate 1 by means of a milling cutter or laser allows for any desired shapes, especially crosses or slits.

Figure 1J:
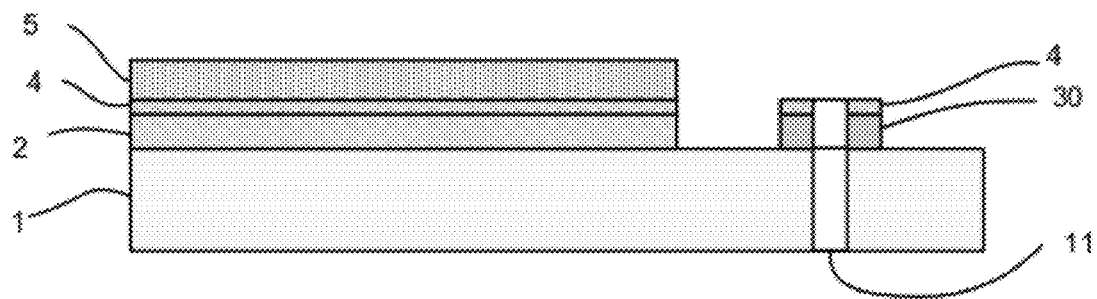
FIG. 1j shows a sectional view through the substrate after a hole has been applied which traverses the substrate and the non-transparent area.

At least the following two variants are possible, which can be used individually or in combination with each other:

G1) A hole 31 is present in a reference mark 30 at the respective position for each positioning pin of each electro-optical component which is to be mounted on the printed circuit board. The reference mark 30 shown in FIG. 2b comprises two holes 31. The reference mark 30 shown in FIG. 2c comprises a single hole 31. These holes 31 are now converted in method step G into holes 11 which penetrate the substrate 1. FIG. 1j shows the printed circuit board after this step.

G2) The holes necessary for accommodating the positioning pins are produced at other locations in the substrate 1 which are disposed at other locations than the reference marks 30, for example when an electro-optical component is to be connected to another metallization plane.

Figure 1K:
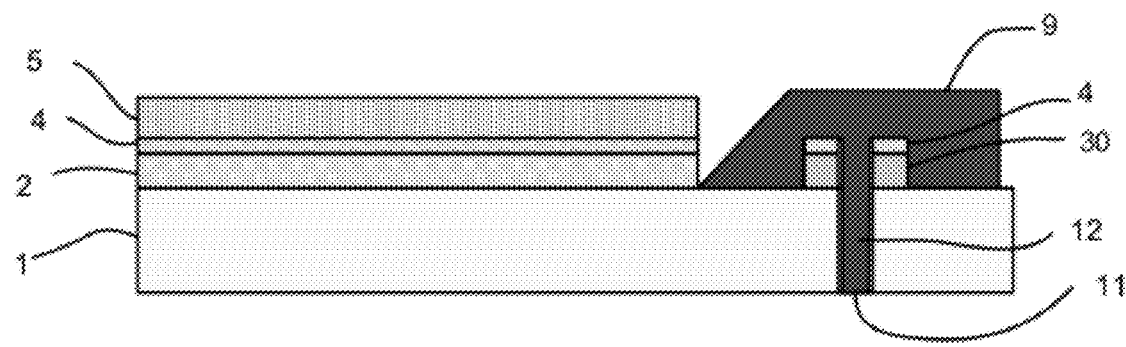
FIG. 1k shows an electro-optical component mounted on the substrate.

FIG. 1k shows an example of a printed circuit board in which an electro-optical component 9 with integrated positioning pins 12 is mounted. The electro-optical component 9 is positioned and fixed in a highly precise manner with respect to the core layer 4 of the optical waveguide structure, with an interlocking connection of the electro-optical component 9 with the electro-optical printed circuit board being possible. The electro-optical component 9 is for example a mirror module or an electro-optical converter or an opto-electrical converter. Examples for such converters are LEDs, laser diodes or photodiodes.

Figure 3A:
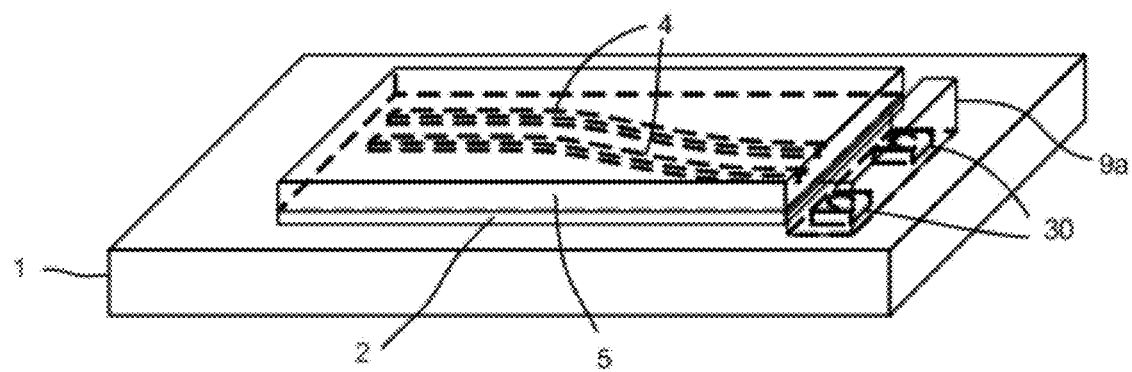
FIG. 3a shows a perspective view of an electro-optical printed circuit board with a coupled mirror module.

FIG. 3a shows a perspective view of an electro-optical printed circuit board with an optical waveguide structure which is coupled with a mirror module 9a. The holes 11 which are necessary for accommodating the positioning pins of the mirror module 9a pass through the reference marks 30.

Figure 3B:
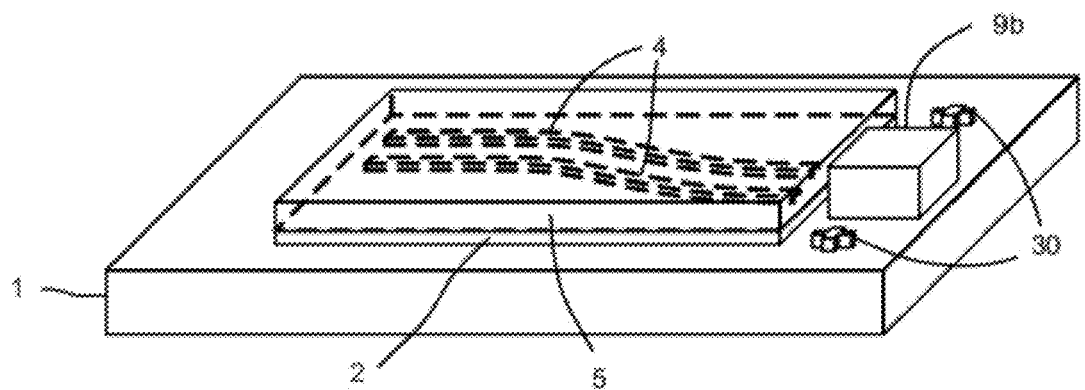
FIG. 3b shows a perspective view of an electro-optical printed circuit board with a coupled diode.
Figure 3C:
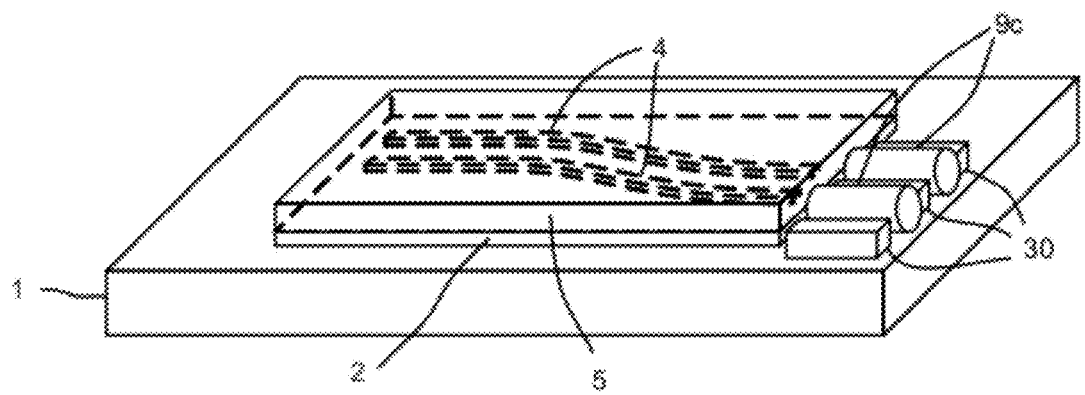
FIG. 3c shows a perspective view of an electro-optical printed circuit board with parts of coupled glass fibers.

FIG. 3b shows a perspective view of an electro-optical printed circuit board with an optical waveguide structure which is coupled with an electro-optical or opto-electrical converter 9b. The converter 9b was aligned and fixed during mounting on the basis of reference marks 30 arranged adjacent to its location.

Since the visible reference marks 30 characterize the position of the invisible optical waveguide structure, it is not necessary for the precise adjustment of the electro-optical components 9 to detect the position of the optical waveguide structure. When the electro-optical components 9 are positioned by means of the reference marks 30 on the printed circuit board as described, they are automatically positioned correctly with respect to the core layer 4 of the optical waveguide structure.

The positioning of certain electro-optical components 9 can also occur relative to non-transparent, non-structured areas 3 which are not covered at all or only partly covered by a core layer 4, which occurs in the case where the positioning precision is still sufficient.

Figure 4:
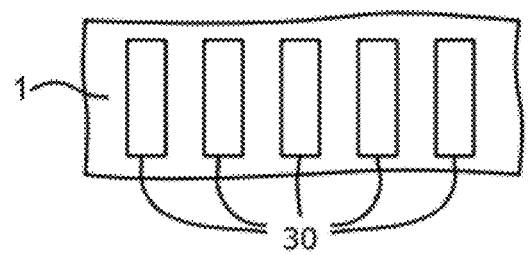
FIG. 4 shows a top view of several non-transparent areas spaced from one another.

It is often necessary to inject optical signals from glass fibers into optical waveguide structures in the electro-optical printed circuit board. FIG. 4 shows a possible solution for this problem. A reference mark 30 is formed in such a way that the structures produced with the methods steps C1 (or C2) and D are cavities in which the glass fibers 9c can be inserted. This is especially possible when the layer thickness of the metal layer is sufficiently large, so that the cavities define the position of the glass fibers 9c in a mechanical manner. Class fibers 9c typically have a diameter of approx. 150 μm. When the thickness of the metal layer is approximately half as large as the diameter of the glass fibers 9c, then this is usually sufficient for its precise positioning. If necessary, the cavities of the reference mark 30 can be deepened into grooves extending into the substrate 1 by means of mechanical machining or by means of laser machining The reference marks 30 can be used alternatively in order to mill grooves in a precisely positioned manner into the substrate 1. The reference marks 30 are used for aligning the machine tool or as screens for the laser beam. As a result of the precise alignment of the cavities of the reference marks 30 or the grooves relative to the core layer 4 of the optical waveguide structure, a precise positioning of the glass fibers 9c relative to the core layer 4 is automatically provided. The glass fibers 9c therefore do not need to be adjusted in a complex manner during mounting.

The electro-optical printed circuit boards can contain highly complex optical structures with a very large number of optical waveguide structures. Further printed circuit boards can be mounted on the electro-optical printed circuit boards with optical waveguide structures, so that the optical waveguide structures form inside layers between the printed circuit boards.

Polymer dry film materials can be used as an alternative to fluid, with electromagnetic radiation curable polymers.

Figure 5:
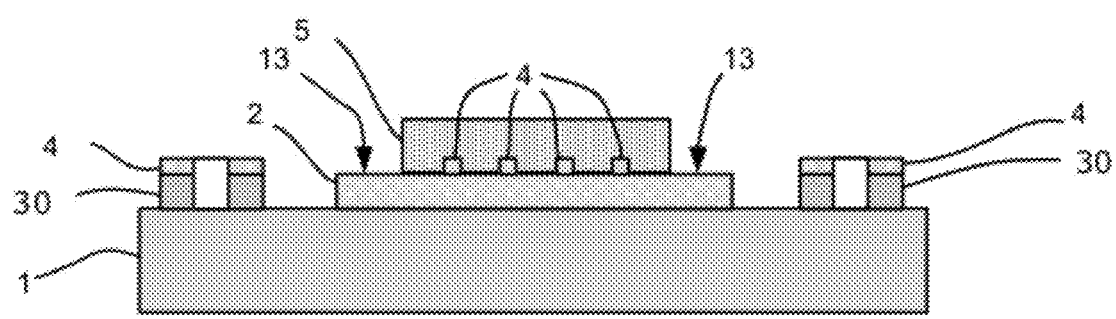
FIG. 5 shows a sectional view through the substrate with partly uncovered bottom layer.

The layer thickness of the bottom layer 2, the core layer 4 and the cladding layer 5 can be produced with a precision of a few μm. This precision is sufficient in many cases in order to align the optical waveguide structures and the electro-optical components 9 with the required precision also with respect to the height. If a higher precision is required, the upper cladding layer 5 is exposed in such a way that during the next following washing step the bottom layer 2 is partly uncovered at the defined exposure areas 13. This state is shown in FIG. 5. The exposure areas 13 define the height of the core layer 4 and thus the position of the parts of the optical waveguide structures which conduct the light. Electro-optical components 9 which are formed accordingly can be placed on such exposure areas 13, so that a precise alignment in the height also occurs automatically without any further adjustment.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method for producing an electro-optical printed circuit board, the board including an optical waveguide structure having a transparent bottom layer disposed over a substrate, a transparent core layer disposed over the bottom layer, and a cladding layer disposed over the core layer, the method comprising:
    forming a non-transparent area consisting of a non-transparent material on the substrate;
    applying the bottom layer to the substrate so that the bottom layer does not cover the non-transparent area;
    applying the core layer so that the core layer covers the bottom layer and the non-transparent area;
    structuring the core layer by exposing to electromagnetic radiation through a single exposure mask and subsequently removing non-exposed portions of the core layer so as to leave exposed portions of the core layer remaining on the bottom layer as part of the waveguide structure and to leave exposed portions of the core layer remaining on the non-transparent area forming a structured region,
    applying the cladding layer so that the cladding layer does not cover the at least one opening of the structured region, and
    removing material from the non-transparent area within the structured region for forming at least one reference mark.

2. The method according to claim 1, wherein said removing of material occurs by an etching process with the structured region used as etching mask.

3. The method according to claim 1, comprising the further step:
    using the at least one reference mark for producing holes or recesses in the substrate.

4. The method according to claim 2, comprising the further step:
    using the at least one reference mark for producing holes or recesses in the substrate.

5. The method according to claim 1, comprising the further step:
   partly removing the cladding layer to uncover the bottom layer at defined exposure areas.

6. The method according to claim 2, comprising the further step:
   partly removing the cladding layer to uncover the bottom layer at defined exposure areas.

7. The method according to claim 3, comprising the further step:
   partly removing the cladding layer to uncover the bottom layer at defined exposure areas.

8. The method according to claim 4, comprising the further step:
   partly removing the cladding layer to uncover the bottom layer at defined exposure areas.

9. The method according to claim 2, wherein said non-transparent material comprises a metal.

10. The method according to claim 4, wherein said non-transparent material comprises a metal.

11. A method for producing an electro-optical printed circuit board, the board including an optical waveguide structure having a transparent bottom layer disposed over a substrate, a transparent core layer disposed over the bottom layer, and a cladding layer disposed over the core layer, the method comprising:
   forming a non-transparent area consisting of a non-transparent material on the substrate;
   applying the bottom layer to the substrate so that the bottom layer does not cover the non-transparent area;
   applying the core layer and a photoresist layer so that the core layer does not cover the non-transparent area and the photoresist layer does cover the non-transparent area;
   structuring the core layer and the photoresist layer by exposing to electromagnetic radiation through a single exposure mask and subsequently removing non-exposed portions of the core layer and the photoresist layer so as to leave exposed portions of the core layer remaining on the bottom layer as part of the waveguide structure and to leave exposed portions of the photoresist layer remaining on the non-transparent area forming a structured region,
   applying the cladding layer so that the cladding layer does not cover the at least one opening of the structured region, and
   removing material from the non-transparent area within the structured region for forming at least one reference mark.

12. The method according to claim 11, wherein said removing occurs by an etching process with the structured region used as etching mask.

13. The method according to claim 11, comprising the further step:
   using the at least one reference mark for producing holes or recesses in the substrate.

14. The method according to claim 12, comprising the further step:
   using the at least one reference mark for producing holes or recesses in the substrate.

15. The method according to claim 11, comprising the further step:
   partly removing the cladding layer to uncover the bottom layer at defined exposure areas.

16. The method according to claim 12, comprising the further step:
   partly removing the cladding layer to uncover the bottom layer at defined exposure areas.

17. The method according to claim 13, comprising the further step:
   partly removing the cladding layer to uncover the bottom layer at defined exposure areas.

18. The method according to claim 14, comprising the further step:
   partly removing the cladding layer to uncover the bottom layer at defined exposure areas.

19. The method according to claim 12, wherein said non-transparent material comprises a metal.

20. The method according to claim 14, wherein said non-transparent material comprises a metal.

* * * * *